United States Patent
Kawagoe

(12) 
(10) Patent No.: US 6,208,548 B1
(45) Date of Patent: Mar. 27, 2001

(54) SLAVE CIRCUIT SELECT DEVICE WHICH CAN INDIVIDUALLY SELECT A PLURALITY OF SLAVE CIRCUITS WITH ONE DATA BUS

(75) Inventor: Tomoya Kawagoe, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/025,838

(22) Filed: Feb. 19, 1998

(30) Foreign Application Priority Data

Aug. 27, 1997 (JP) .................................................... 9-231145

(51) Int. Cl.$^7$ ...................................................... G11C 5/06
(52) U.S. Cl. .............................. 365/63; 365/51; 365/194
(58) Field of Search ................................... 365/51, 52, 63, 365/230.03, 194

(56) References Cited

U.S. PATENT DOCUMENTS 5,982,654 * 11/1999 Corisis ..................................... 365/63
6,026,008 * 2/2000 Feese ....................................... 365/63
6,028,781 * 2/2000 Vogley et al. ........................... 365/52

FOREIGN PATENT DOCUMENTS 5-250280   9/1993   (JP) .

* cited by examiner

Primary Examiner—Huan Hoang
(74) Attorney, Agent, or Firm—McDermott, Will & Emery

(57) ABSTRACT

A select signal generating circuit S2 issues two pulse signals onto select signal line CEL under the control by chip 0 of a master chip. The select signal line CEL has a folded form. The D-flip-flop detects the fact that the second pulse signal issued from the select signal generating circuit S2 arrives at the position of the corresponding slave chip when a first pulse signal issued from the select signal generating circuit S2 and returning from the folded point of the select signal line CEL arrives at the position of the same slave chip, whereby selection of the chip is performed.

11 Claims, 7 Drawing Sheets

SLAVE CIRCUIT SELECT DEVICE WHICH CAN INDIVIDUALLY SELECT A PLURALITY OF SLAVE CIRCUITS WITH ONE DATA BUS

BACKGROUND OF THE INVENTION

1. Field of the Invention

The present invention relates to a select circuit for selecting a circuit in a specific portion of a system formed of electronic circuits.

2. Description of the Background Art

Some of systems formed of electronic circuits operate in such a manner that a specific device (e.g., a bus master circuit such as a CPU) selects one of a plurality of devices (e.g., slave circuits such as memories) with a select circuit for input/output of data through a data bus.

FIG. 6 is a schematic block diagram showing a system which employs a conventional select circuit and is formed of a master circuit such as a CPU or the like and slave circuits such as dynamic semiconductor memory devices which will be referred to as "DRAMs", or static semiconductor memory devices which will be referred to as "SRAMS" hereinafter.

Referring to FIG. 6, a chip 0 which is a chip of a bus master carries a CPU issues onto a select signal line CM a signal specifying a chip to be selected among chips 1–3 of slave circuits, and transmits data to and from chips 1–3 through a data bus BUS.

Chips 1–3 which are slave chips formed of DRAMs or SRAMs output or input data onto or from data bus BUS through data I/O terminals DQc1–DQc3 when corresponding chip enable signal input terminals CE1–CE3 receive active signals at "H" level, respectively.

A select signal generating circuit S1 activates (i.e., sets to "H" level) one of chip select signals CS1–CS3, which are applied to chips 1–3 of the slave chips, respectively, in response to a signal sent from chip 0 of the master circuit through select signal line CM.

An operation in which chip 0 of the master chip receives data from chip 3 of the slave chip will now be described as an example of the operation of the structure shown in FIG. 6.

FIG. 7 is a timing chart showing the above operation.

Chip 0 of the bus master sends to select signal generating circuit S1 a signal instructing it to activate chip select signal CS3 to attain "H" level.

Select signal generating circuit S1 sets signal CS3 to the active state ("H" level) in response to the signal sent from chip 0 of the bus master at time $\tau 0$.

Due to delay on a signal interconnection, the potential level on chip enable signal input terminal CE3 of chip 3 of the slave chip (i.e., the potential level on a node P3 of the signal interconnection) attains the active state ("H" level) after a time period of $3 \times \tau 0$ from time t0. Chip 3 of the slave chip sends the data to data I/O terminal DQc3 at time t2 after a constant time period, which is assumed to be equal to $\tau 0$ for simplicity reason, from activation of the potential level on chip enable signal input terminal CE3.

In the following description, it is assumed that the chips 1–3 of the slave chips continuously issue nine data with a cycle time of $\tau 0$.

At time t3 after a time period of $3\tau 0$ from time t2, chip 0 of the bus master receives through data bus BUS the data, which is sent from chip 3 of the slave chip and takes the form of change in potential on node DQ0 between data bus BUS and chip 0.

Description will be further given on the case that bus master chip 0 receives the data from chip 1 of the slave chip subsequently to start of reception of the data from chip 3 of the slave chip at time t3.

Chip 0 of the bus master issues to select signal generating circuit S1 signal CM instructing deactivation ("L" level) of signal CS3 after a time period of $9 \times \tau 0$ from issuance of the instruction for setting signal CS3 to the active state ("H" level).

At the same time, chip 0 of the bus master sends signal CM instructing activation ("H" level) of signal CS1 to select signal generating circuit S1.

Select signal generating circuit S1 keeps signal CS3 in the active state ("H" level) for a time period of $9 \times \tau 0$ from time t0 to time t4 in accordance with the signal sent from chip 0 of the bus master, and subsequently keeps signal CS1 in the active state ("H" level) for a time period of $9 \times \tau 0$ from time t4 to time t8.

Due to an interconnection delay, the potential level on chip enable signal input terminal CE3 of chip 3 of the slave chip (i.e., potential level on node P3) attains the inactive state ("L" level) at time t7 after a time period of $3 \times \tau 0$ from time t4. The potential level on chip enable signal input terminal CE1 of chip 1 of the slave chip (i.e., potential level on node P1) attains the active state ("H" level) at time t5 after a time period of $\tau 0$ from time t4.

Further, chip 1 issues the data to data I/O terminal DQc1 at time t6 after a time period of $\tau 0$ from time t5.

As described above, chip 0 of the bus master receives the data issued from chip 3 through data bus BUS when a time period of $3 \times \tau 0$ elapses after chip 3 starts output of the data. Chip 0 of the bus master receives the data when a time period of $\tau 0$ elapses after chip 1 of the slave chip starts output of the data.

However, chip 1 of the slave chip is located near bus master chip 0 so that the data sent from chip 1 of the slave chip arrives at chip 0 of the bus master in a shorter time than the data from the other slave chips. This may results in such a problem that the data sent from chip 1 of the slave chip arrives at the bus master while chip 0 of the bus master is receiving the data sent from chip 3 forming the slave ship, and therefore collision of data occurs.

For avoiding the above data collision, Japanese Patent Laying-Open No. 5-250280 (1993) has disclosed a structure in which output of data from slave chips starts in response to a start signal sent through a path of which is folded at a chip remotest from the bus master.

According to this structure, however, one start signal is supplied to all the slave chips, and the slave chips output the data after individually determined delay times, respectively. Therefore, one start signal operates to read or write the data from or into all the slave chips so that it is impossible to select one of the slave chips for reading or writing the data.

SUMMARY OF THE INVENTION

An object of the invention is to provide a select circuit for a system in which a master circuit transmits data to and from a plurality of slave circuits, and particularly the select circuit which can avoid collision of data sent from the slave circuits even when selection of arbitrary one of the slave circuits is performed successively.

Another object of the invention is to provide a select circuit which can be used for transmission of data by a master circuit with respect to a plurality of slave circuits, and can perform selection of slave circuits with a simple structure without increasing the number of buses for selecting the slave circuits.

In summary, the invention provides a slave circuit select device including a select signal generating circuit, a signal interconnection and select circuits.

The select signal generating circuit issues a select signal including two pulse signals in response to a control signal sent from a master circuit. The signal interconnection is divided into first and second interconnection portions, and is folded at a boundary between the first and second interconnection portions. The select circuits are provided correspondingly to a plurality of slave circuits to be selected in accordance with a signal transmitted through the signal interconnection, respectively, and are arranged at corresponding positions on the signal interconnection, respectively.

For selecting the slave circuit corresponding to the specific select circuit, the select signal generating circuit issues the two pulse signals to one end of the signal interconnection such that a time interval between the two pulse signals corresponds to a delay time in transmission of the pulse signal from the specific select circuit to the specific select circuit through the first interconnection portion, the boundary and the second interconnection portion. The select circuit selects the corresponding slave circuit in response to the active state of both the pulse signals sent from the first and second interconnection portions.

According to another aspect, a slave circuit select device includes a select signal generating circuit, a signal interconnection and select circuits.

The select signal generating circuit issues a select signal including two pulse signals in response to a control signal sent from a master circuit.

The signal interconnection has a length of $L=2 \times n \times UL$ (n: natural number, UL: a predetermined unit length). The signal interconnection includes a first interconnection portion extending from one end and having a length of $n \times UL$, and a second interconnection portion folded with respect to the first interconnection portion and having a length of $n \times UL$.

The select circuits are provided correspondingly to slave circuits of m (m: natural number, m<n) in number to be selected in accordance with the signal transmitted through the signal interconnection. The select circuit at an ith (i: natural number) position among the select circuits is arranged at a distance of $j \times UL$ (j: natural number) allocated to the same select circuit from the folded position of the signal interconnection along the signal line.

The select signal generating circuit issues the two pulse signals at a time interval of $2 \times j \times t$ to the one end of the signal interconnection for selecting the slave circuit corresponding to the select circuit at the ith position, t being a time required for transmission of the pulse signal through a distance of UL.

The select circuit selects the corresponding slave circuit in response to the active state of both the pulse signals sent from the first and second interconnection portions.

According to still another aspect, a slave circuit select device includes a select signal generating circuit, a signal interconnection and select circuits.

The select signal generating circuit issues a select signal including two pulse signals in response to a control signal sent from a master circuit. The signal interconnection is folded at its central portion to divide the same into first and second interconnection portions. The plurality of slave circuits are provided correspondingly to a plurality of slave circuits to be selected in accordance with a signal transmitted through the signal interconnection, respectively.

The plurality of select circuits are arranged along the signal interconnection with a space DL between each other, and the select circuit nearest to the folded position of the signal interconnection is spaced by a predetermined distance Lp from the folded position.

The select signal generating circuit issues the two pulse signals at a time interval of $2 \times \{\tau 1 + \tau 2(j-1)\}$ to one end of the signal interconnection for selecting the slave circuit corresponding to the select circuit at a jth position from the folded position of the signal interconnection, $\tau 1$ being a time required for transmission of the pulse signal through the distance of Lp and $\tau 2$ being a time required for transmission of the pulse signal through the distance of DL.

The select circuit selects the corresponding slave circuit in response to the active state of both the pulse signals sent from the first and second interconnection portions.

Accordingly, the invention can achieve such an advantage that the master circuit can arbitrarily select the plurality of slave circuits with the one signal line in a folded form.

As another advantage of the invention, collision does not occur between data sent from the plurality of slave circuits, because the time period from the time when the master circuit operates to issue the select signal from the select signal generating circuit to the time when the master circuit receives the data sent from the slave circuit is constant independently of the position of the slave circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
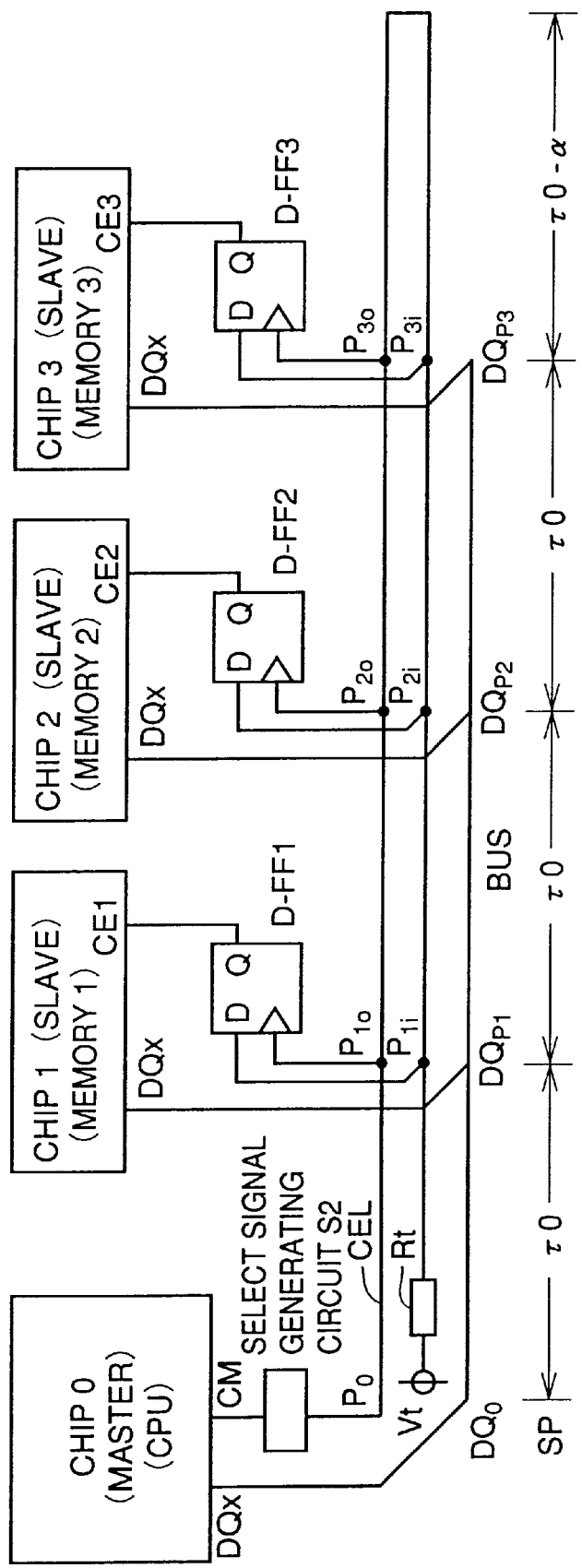
FIG. 1 is a schematic block diagram showing a structure of a select circuit 1000 of an embodiment 1 of the invention.

FIG. 1 is a schematic block diagram showing a structure of a select circuit 1000 of an embodiment 1 of the invention.

For simplicity reason, the following description will be given on a structure, in which one master circuit transmits data to and from three slave circuits (chips 1–3).

The select circuit 1000 includes a select signal generating circuit S2. Select signal generating circuit S2 responds to a signal, which is sent from a chip 0 of the bus master through a select signal line CM and indicates the chip to be selected among the chips 1–3 of the slave chips, and thereby issues onto a select signal line CEL two pulses at "H" level, each of which has a time width of $\tau 0$ and is spaced from the other by a time interval of $6 \times \tau 0$, $4 \times \tau 0$ or $2 \times \tau 0$ depending on the slave chip to be selected, within a time period of $9 \times \tau 0$.

Select circuit 1000 further includes a select signal line CEL, which extends from select signal generating circuit S2 along all the slave chips, is folded and returns toward select signal generating circuit S2, D-flip-flop circuits D-FF1–F-FF3 provided correspondingly to the slave chips, respectively, and a resistor Rt connected to an end of signal line CEL remote from a connection to select signal generating circuit S2. It is now assumed that the resistance value of resistor Rt is coincident with a characteristic impedance of select signal line CEL.

Owing to the above structure, the pulse signal issued from select signal generating circuit S2 is completely absorbed in resistor Rt at the remote end, and reflection of the pulse signal does not occur at the remote end of the select signal line CEL.

A trigger terminal of D-flip-flop circuit D-FF1 is connected to select signal line CEL at a position where the transmission delay of the signal sent from chip 0 of the bus master (or select signal generating circuit S2) is $\tau 0$. Likewise, a trigger terminal of D-flip-flop circuit D-FF2 is connected at a position where the transmission delay is $2 \times \tau 0$, and a trigger terminal of D-flip-flop circuit D-FF3 is connected at a position where the transmission delay is $3 \times \tau 0$.

A data terminal D of D-flip-flop circuit D-FF1 is connected to select signal line CEL at a position where the transmission delay of the signal sent from chip 0 of the bus master (or select signal generating circuit S2) is $7 \times \tau 0$. A data terminal D of D-flip-flop circuit D-FF2 is connected at a position where the transmission delay is $6 \times \tau 0$. A data terminal D of D-flip-flop circuit D-FF3 is connected at a position where the transmission delay is $5 \times \tau 0$.

Output terminals Q of D-flip-flop circuits D-FF1–D-FF3 are connected to chip enable terminals CE1–CE3 of chips 1–3 of the slave chips, respectively.

Figure 2:
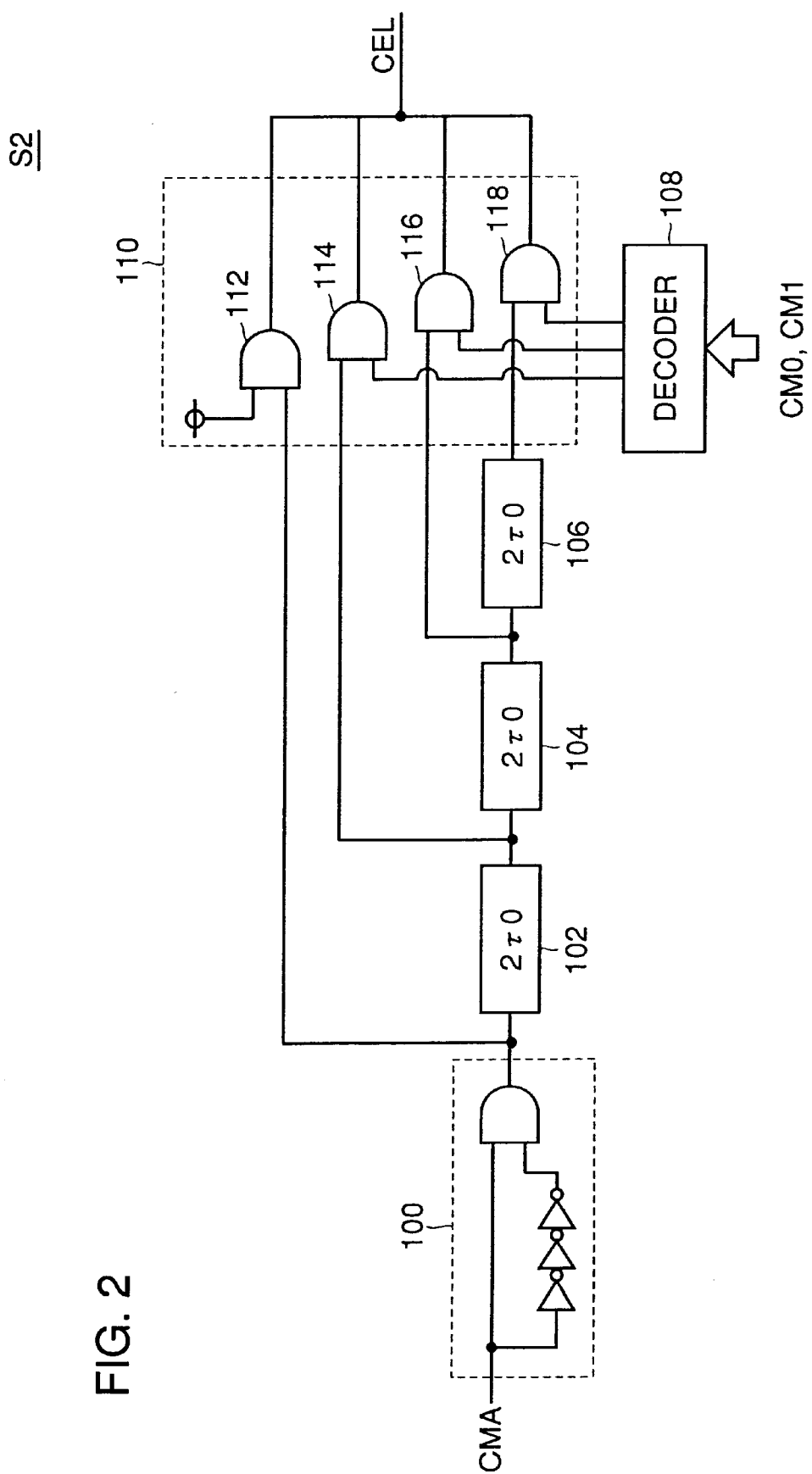
FIG. 2 is a schematic block diagram showing a structure of a select signal generating circuit S2.

FIG. 2 is a schematic block diagram showing a structure of select signal generating circuit S2 shown in FIG. 1.

In the following description, it is assumed that signal CM issued from chip 0 of the bus master includes a signal CMA for activating select signal generating circuit S2 and address signals CM0–CM1 designating the slave chip to be selected.

Select signal generating circuit S2 includes a one-shot pulse generating circuit 100 which is activated by signal CMA to issue a pulse signal of a time with of $\tau 0$, a delay circuit 102 which receives the output of one-shot pulse generating circuit 100 and issues the same with a delay of a time of $2 \times \tau 0$, a delay circuit 104 which receives the output of delay circuit 102 and issues the same with a delay of a time of $2 \times \tau 0$, a delay circuit 106 which receives the output of delay circuit 104 and issues the same with a delay of a time of $2 \times \tau 0$, a select pulse generating circuit 110 which receives the output of one-shot pulse generating circuit 100 and the outputs of delay circuits 102, 104 and 106, and issues first and second pulse signals onto select signal line CEL, and a decoder 108 which receives signals CMO and CM1, and issues a decoded signal to select pulse generating circuit 110.

Select pulse generating circuit 110 further includes a AND circuit 112, which receives on one of its inputs the output of one-shot pulse generating circuit 100 and on the other input a signal at "H" level (potential level of a power supply potential Vcc), and has an output node connected to interconnection CEL, a AND circuit 114 which receives on one of its inputs the output of delay circuit 102 and on the other input the decoded signal sent from decoder 108, and has an output node connected to signal interconnection CEL, a AND circuit 116 which receives on one of its inputs the output of delay circuit 104 and on the other input the decoded signal sent from decoder 108, and has an output node connected to signal interconnection CEL, and a AND circuit 118 which receives on one of its inputs the output of delay circuit 106 and on the other input the decoded signal sent from decoder 108, and has an output node connected to signal interconnection CEL.

Therefore, select signal generating circuit S2 sends the pulse signal, which is issued from one-shot pulse generating circuit 100, to signal interconnection CEL through AND circuit 112 in response to signal CMA issued from chip 0 of the bus master, and thereafter responds to address signals CM0 and CM1 applied to decoder 108 by issuing onto the select signal line CEL one of the delayed pulse signals, i.e., the pulse signal issued from delay circuit 102 and delayed by the time of $2 \times \tau 0$, the pulse signal issued from delay circuit 104 and delayed by the time of $4 \times \tau 0$ and the pulse signal issued from delay circuit 106 and delayed by the time of $6 \times \tau 0$.

Figure 3:
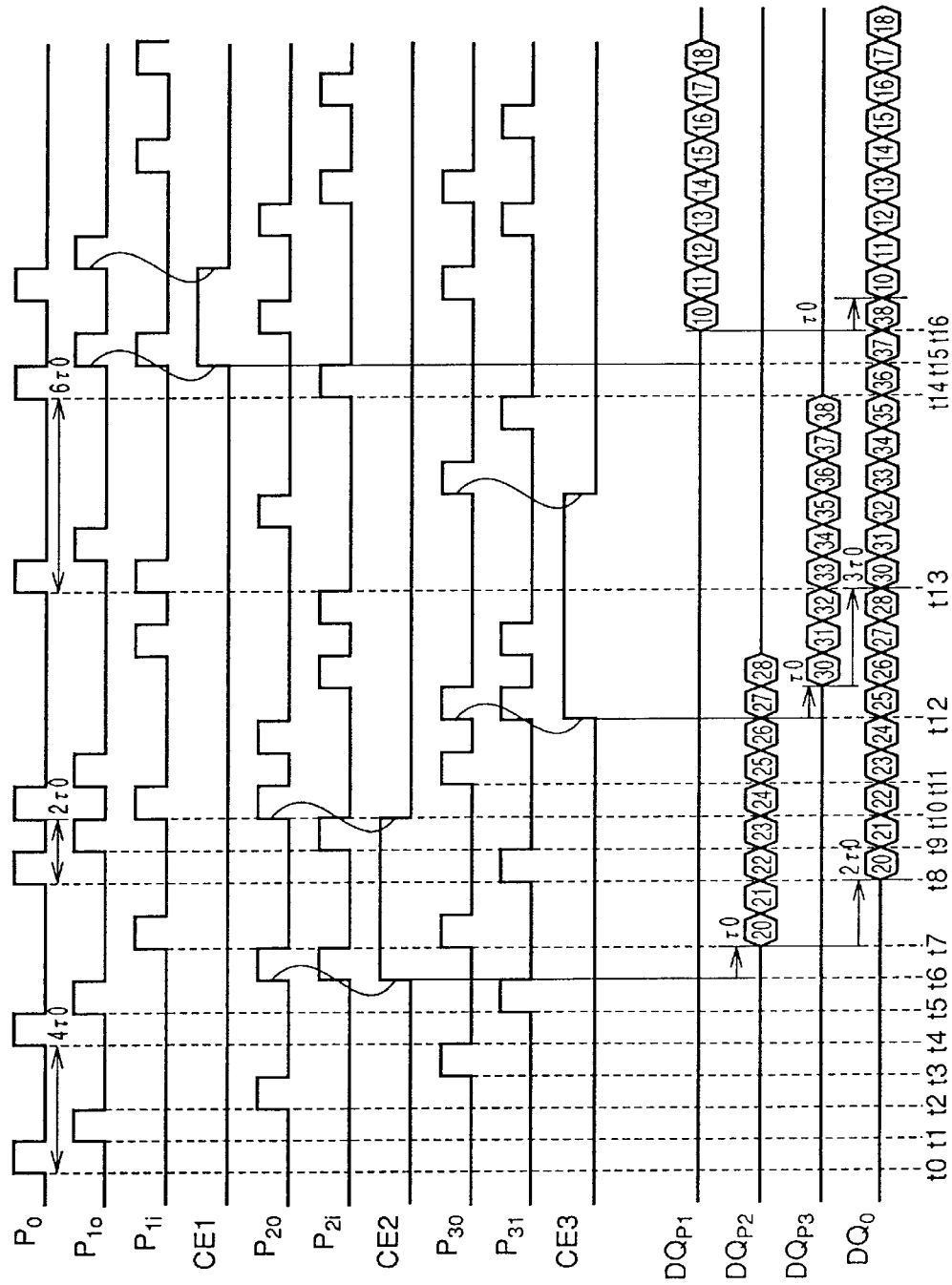
FIG. 3 is a timing chart showing an operation of the select circuit 1000.

FIG. 3 is a timing chart showing an operation of select circuit 1000 shown in FIG. 1.

For selecting chip 2 of the slave chip and receiving data therefrom by chip 0 of the bus master, select signal generating circuit S2 issues the pulse signal at time t0, and then issues the second pulse signal of the width of $\tau 0$ onto select signal line CEL after a time interval of $4 \times \tau 0$. D-flip-flop circuit D-FF2 provided correspondingly to chip 2 of the slave chip receives on its trigger terminal the first pulse at time t2 after a time period of $2 \times \tau 0$ from time t0, and receives on the same the second pulse at time t6 after a time period of $6 \times \tau 0$ from time t0.

D-flip-flop circuit D-FF2 receives on its data terminal the first pulse at time t6 after a time period of $6 \times \tau 0$ from time t0 and receives on the same the second pulse at time t9 after a time period of $10 \times \tau 0$ from time t0.

The potential level on the output terminal of D-flip-flop circuit D-FF2 does not change and is held at "L" level because the potential level on the data terminal thereof is at "L" level when the first pulse arrives at the trigger terminal at time t2.

Therefore, the potential level on the chip enable signal input terminal of chip 2 of the slave chip is kept at "L" level so that chip 2 is yet not selected at this point of time.

When the second pulse arrives at the trigger terminal of D-flip-flop circuit D-FF2 at time t6 after a time period of $6 \times \tau 0$ from time t0, the first pulse signal arrives at the data terminal of D-flip-flop circuit D-FF2. Therefore, both the potentials on the trigger and data terminals are at "H" level at this time so that the output terminal Q of D-flip-flop circuit D-FF2 carries the potential at "H" level. Thereby, the potential on the chip enable signal input terminal of chip 2 of the slave chip is driven to "H" level, and chip 2 is selected.

Chip 2 starts output of the data at time t7 after a time period of $\tau 0$ from time t6 owing to the fact that the potential on the chip enable signal input terminal attains "H" level, and thereafter continues output of the data for a time period of $9 \times \tau 0$.

For a period from time t0 to time t7, the pulse signals are supplied to the data terminals and trigger terminals of D-flip-flop circuits D-FF1 and D-FF3 provided correspondingly to chips 1 and 3 of the slave chips, respectively. However, the potential levels on the data terminal and trigger terminal of D-flip-flop circuit D-FF1 or D-FF3 simultaneously attain "H" level only when the first and second pulse signals are spaced by the period of $6 \times \tau 0$ or $2 \times \tau 0$. Therefore, the chip 1 and chip 3 are not selected when chip 2 is selected, i.e., when the two pulse signals are spaced by $4 \times \tau 0$.

The data issued from chip 2 of the slave chip first arrives at chip 0 of the bus master after a time period Td from time t0 when chip 0 starts selection of chip 2. This time Td can be expressed as follows.

$Td=T1$ (time required for arrival of the first pulse at the data terminal of D-flip-flop circuit D-FF2)+$T2$ (time between selection of chip 2 to output of data)+$T3$ (time required for arrival of data at chip 0)=6τ0+τ0+2τ0=9τ0

When chip 1 is selected and therefore select signal generating circuit S2 issues two pulses at a time interval of 6τ0, the following relationship is likewise exhibited.

$$Td = T1 + T2 + T3$$
$$= 7\tau 0 + \tau 0 + \tau 0$$
$$= 9\tau 0$$

When chip 3 is selected and therefore select signal generating circuit S2 issues two pulses at a time interval of 2τ0, the following relationship is likewise exhibited.

$$Td = T1 + T2 + T3$$
$$= 5\tau 0 + \tau 0 + 3\tau 0$$
$$= 9\tau 0$$

Times Td are constant independently of chips 1, 2 and 3.

As shown in FIG. 3, therefore, collision of the outputs of chips 1 to chip 3 does not occur even in the case that chip select signal generating circuit S2, which issued the signal for selecting chip 2 at time t0, additionally issues the signal for selecting chip 3 at time t8 after a time period 9τ0 after time t0, and further issues the signal for selecting chip 1 at time t13 after a time period of 9τ0 from time t8.

Thus, fast and accurate data transmission can be performed between chip 0 of the bus master and chips 1–3 of the slave chips 1–3.

Further, select pulse generating circuit S2 can select one slave chip among the plurality of slave chips 1–3 to output data therefrom in accordance with the pulse interval between the two pulse signals applied onto select signal line CEL.

In the above description, it is assumed for simplicity reason that the delay time of τ0 is required for transmission of the pulse signal from select signal generating circuit S2 to chip 1 of the slave chip.

As can be seen from the above description, however, the invention is not restricted to this.

In the above description, the slave chips are equally spaced from each other. However, the invention is not restricted to this arrangement.

This is because the interval between two pulse signals for selecting, e.g., chip 1 of the slave chip depends on the delay time in transmission from a node P10 to the folded point of select signal line CEL.

When D-flip-flop circuits D-FF1–D-FF3 issuing the chip select signals are used for the corresponding slave chips, respectively, it is preferable that the delay time in transmission between the slave chip, i.e., chip 3 in FIG. 1, nearest to the folded point of the select signal line CEL and the folded point is shorter by a time a than the delay time in transmission other than the above, as shown in FIG. 1.

Figure 4:
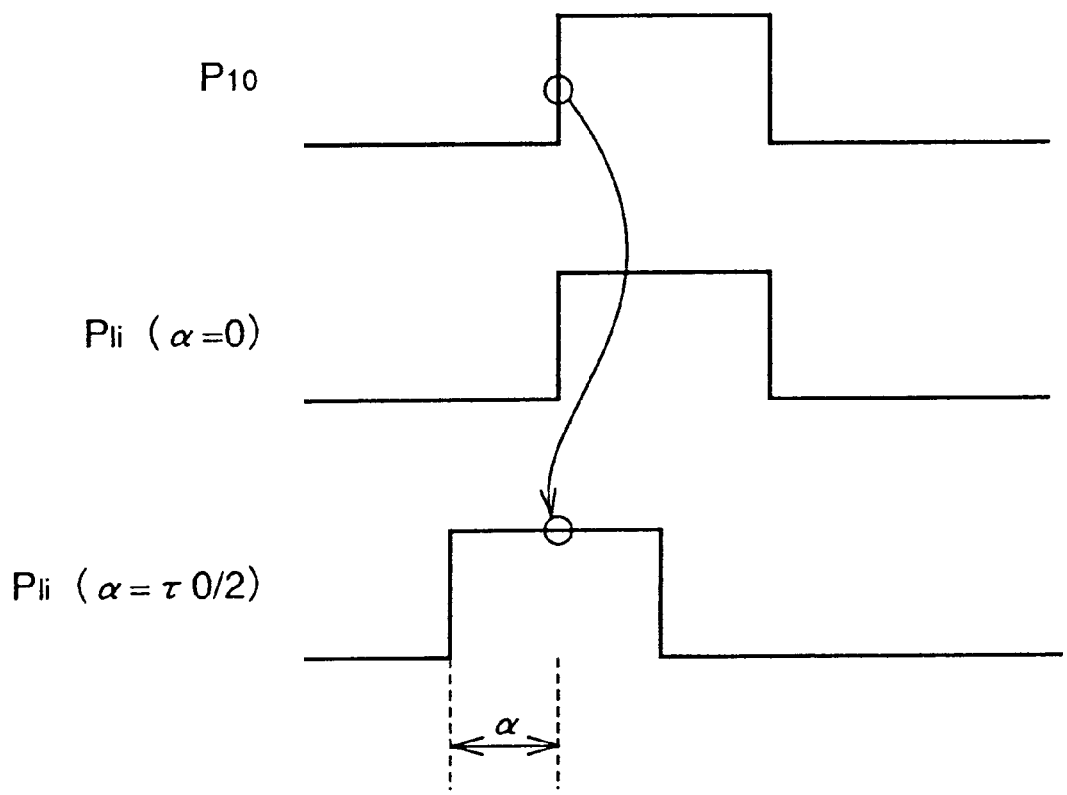
FIG. 4 is a timing chart specifically showing the operation of the select circuit 1000.

FIG. 4 is a timing chart specifically showing timings of the signals applied to the data terminal and trigger terminal of the D-flip-flop circuit D-FF1 provided correspondingly to chip 1 of the slave chip in the cases that time α is 0 and is a half of pulse width of τ0.

In the case of time α=0, as already described with reference to FIG. 3, the potential levels on node P10 and node Pi simultaneously rise to "H" level when select signal generating circuit S2 issues the pulse signal selecting chip 1 of the slave chip.

In response to the rising edge of the signal level on node P10, D-flip-flop circuit D-FF1 takes in the potential level on node P1i through the data terminal and issues an active signal to chip enable signal input terminal C1.

In the case of α=τ0/2, the potential level on node P1i already rose to "H" level at a time earlier by the time a than the rising edge of the signal level on node P10.

As already described, therefore, D-flip-flop circuit D-FF1 can output the data more stably if the time a is set not to 0 but to τ0/2.

The time a can take on an arbitrary value larger than 0 and smaller than a value τ0 of the pulse width of the pulse signal.

As can be understood from the above discussion, however, D-flip-flop circuit D-FF1 has a large operation margin when time a is equal to a half of pulse width τ0.

[Embodiment 2]

Figure 5:
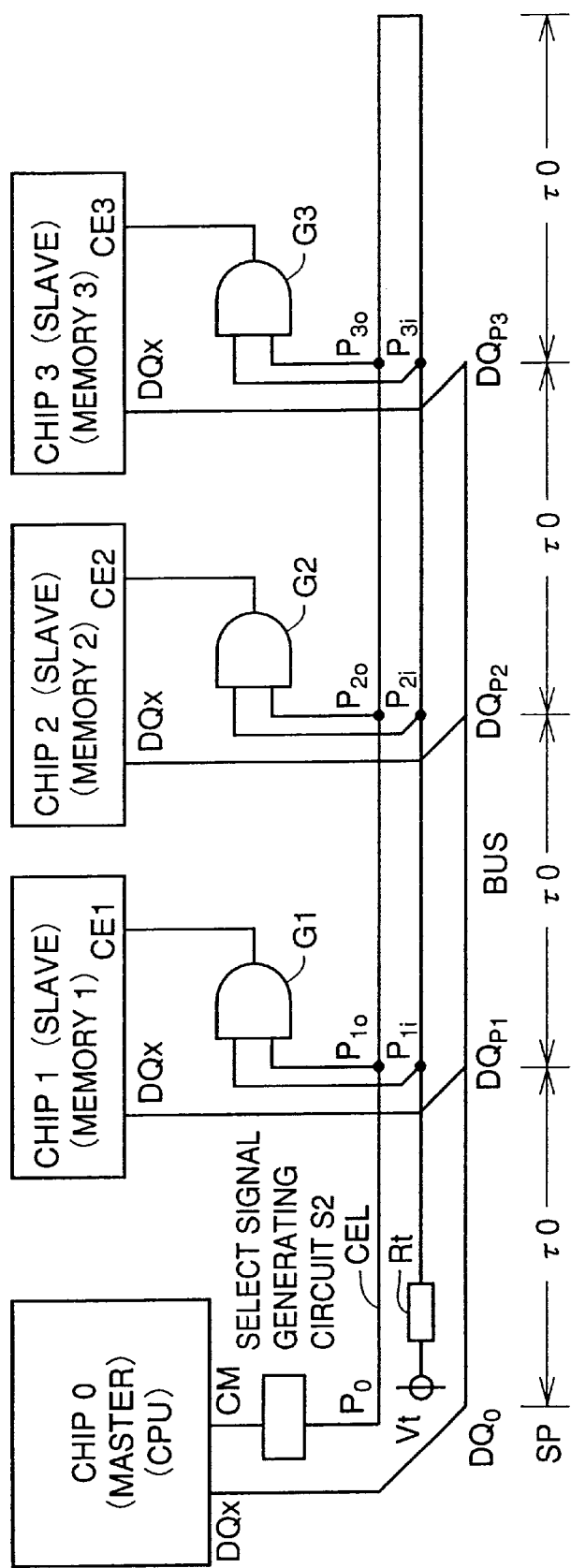
FIG. 5 is a schematic block diagram showing a structure of a select circuit 2000 of an embodiment 2 of the invention.
Figure 6:
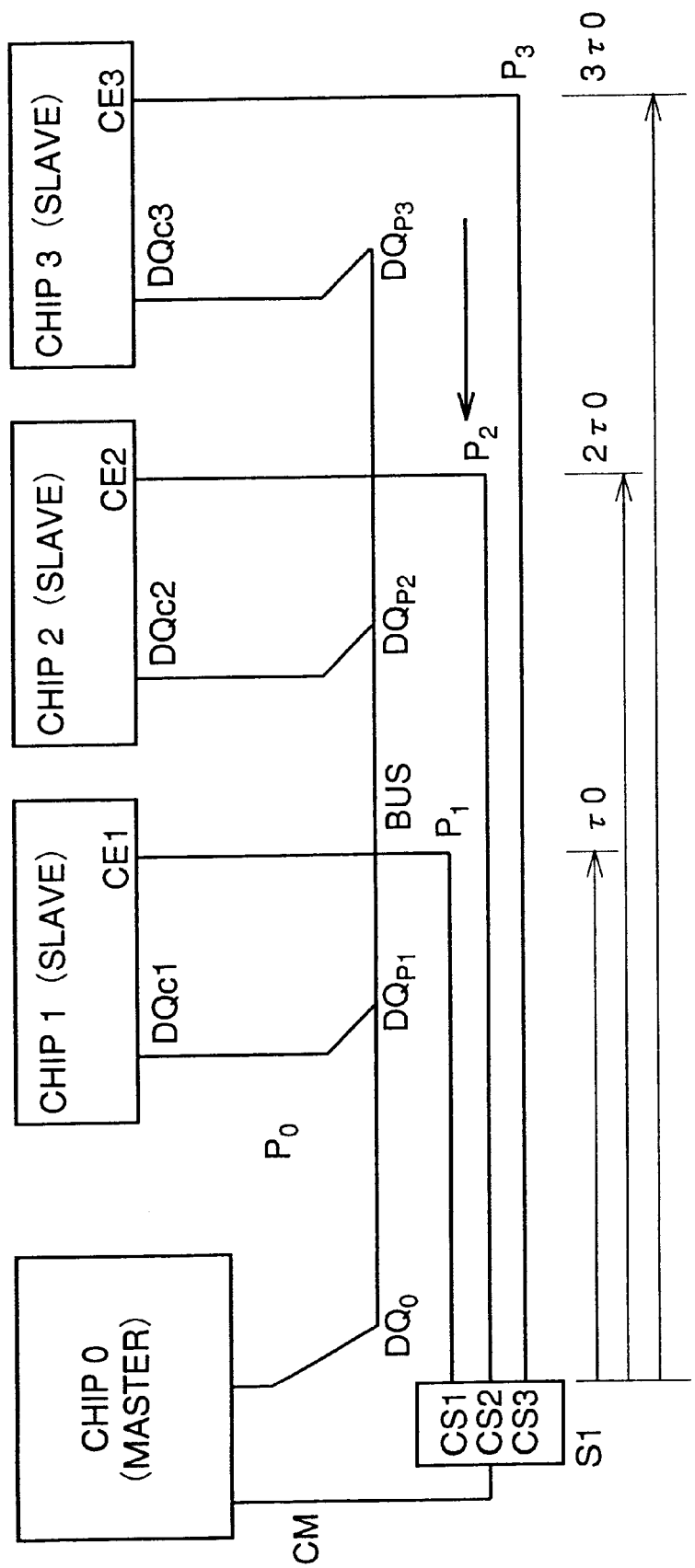
FIG. 6 is a schematic block diagram showing a structure of a select circuit in the prior art.
Figure 7:
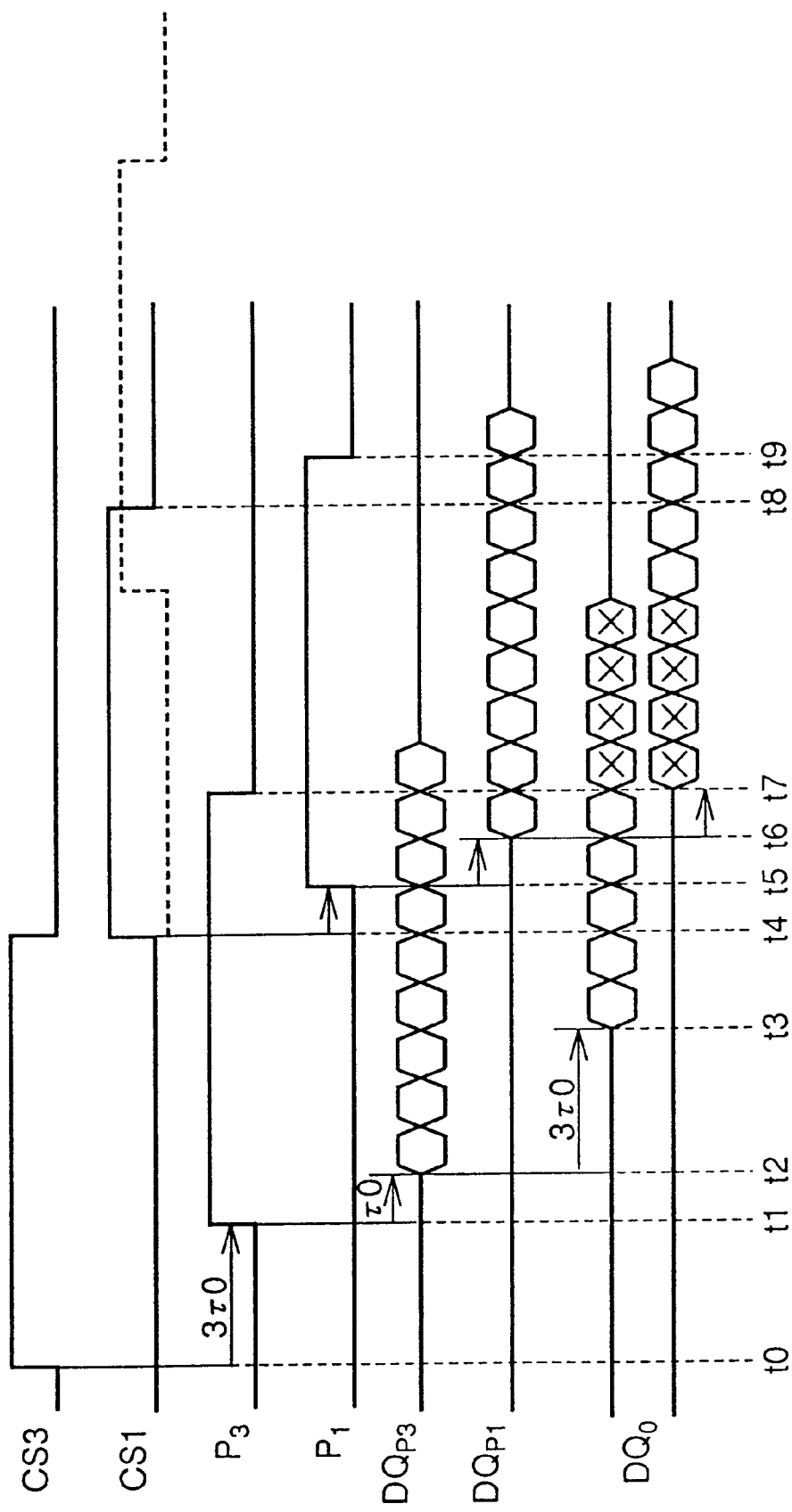
FIG. 7 is a timing chart showing an operation of the select circuit in the prior art.

FIG. 5 is a schematic block diagram showing a structure of a select circuit 2000 of an embodiment 2 of the invention.

The structure of select circuit 2000 differs from select circuit 1000 of the embodiment 1 in that D-flip-flop circuits D-FF1–D-FF3 in the embodiment 1, which are provided for chips 1–3 of the slave chips, are replaced with AND circuits G1–G3, respectively.

Structures other than the above are the same as those of select circuit 1000 of the embodiment 1 shown in FIG. 1. The same parts and portions as those in FIG. 1 bear the same reference characters, and will not be described below.

According to the select circuit of the embodiment 2 shown in FIG. 5, when select signal generating circuit S2 issues two pulse signals at a time interval which sets both the potential levels on nodes P10 and O1i at select signal line CEL corresponding to chip 1 of the slave chip to "H" level, the potential level on a chip enable signal input terminal CE1 of corresponding chip 1 attains "H" level.

The above is true with respect to other chips 2 and 3 of the slave chips.

Owing to the above structure, accurate and fast data transmission can be performed between chip 0 of the bus master and chips 1 to 3 of the slave chips with a more simple structure. Further, one of chips 1 to 3 of the slave chips can be selected in accordance with the pulse interval of the pulse signals applied onto select signal line CEL.

In the above description of the embodiments 1 and 2, select circuits 1000 and 2000 each are formed of the chip of the bus master and the slave chips such as a CPU and memories. However, the invention is not restricted to this. For example, the invention can be applied to selection of a row or column of memory cells in a memory device as well as selection of a memory cell block.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A slave circuit select device comprising:

select signal generating means for issuing a select signal including two pulse signals in response to a control signal sent from a master circuit;

a signal interconnection divided into first and second interconnection portions, and folded at a boundary between said first and second interconnection portions; and a plurality of select means provided correspondingly to a plurality of slave circuits to be selected in accordance with signals transmitted through said signal interconnection, and arranged at corresponding positions on said signal interconnection, respectively, said select signal generating means issuing said two pulse signals to one end of said signal interconnection, for selecting the slave circuit corresponding to specific select means, such that a time interval between said two pulse signals corresponds to a delay time in transmission of one of said pulse signals from said specific select means to said specific select means through said first interconnection portion, said boundary and said second interconnection portion, and said select means selecting the corresponding slave circuit in response to the active state of both the pulse signals sent from said first and second interconnection portions.

2. The slave circuit select device according to claim 1, wherein said plurality of select means are arranged along said signal interconnection with a space of a distance DL between each other, the select means nearest to said boundary is spaced by a predetermined distance Lp from said boundary, and said predetermined distance Lp is smaller by a distance $\alpha$ than said space distance DL, and said distance $\alpha$ is smaller than a transmission distance covered by said pulse signal in a time of the pulse width.

3. The slave circuit select device according to claim 2, wherein said distance $\alpha$ is equal to a transmission distance covered by said pulse signal in a time equal to half the pulse width.

4. A slave circuit select device comprising:

select signal generating means for issuing a select signal including two pulse signals in response to a control signal sent from a master circuit;

a signal interconnection having a length of $L=2\times n\times UL$ (n: natural number, UL: a predetermined unit length), said signal interconnection including a first interconnection portion extending from one end and having a length of $n\times UL$, and a second interconnection portion folded with respect to said first interconnection portion and having a length of $n\times UL$; and a plurality of select means provided correspondingly to slave circuits of m (m: natural number, m<n) in number to be selected in accordance with the signal transmitted through said signal interconnection, the select means at an ith (i: natural number) position among said plurality of select means being arranged at a distance of $j\times UL$ (j: natural number) allocated to the same select means from the folded position of said signal interconnection along a signal line, said select signal generating means issuing said two pulse signals at a time interval of $2\times j\times \tau$ to said one end of said signal interconnection for selecting the slave circuit corresponding to the select means at said ith position, $\tau$ being a time required for transmission one of said pulse signals through a distance of said value UL, and said select means selecting the corresponding slave circuit in response to the active state of both the pulse signals sent from said first and second interconnection portions.

5. The slave circuit select device according to claim 4, further comprising:

antireflection means connected to the other end of said signal interconnection for preventing reflection of the received pulse signal.

6. The slave circuit select device according to claim 5, wherein each of said select means includes an AND gate receiving on one of its inputs the signal sent from said first interconnection portion and receiving on the other input the signal sent from said second interconnection portion.

7. The slave circuit select device according to claim 5, wherein each of said select means includes a D-flip-flop receiving the signal sent from said second interconnection portion in accordance with the signal sent from said first interconnection portion.

8. A slave circuit select device comprising:

select signal generating means for issuing a select signal including two pulse signals in response to a control signal sent from a master circuit;

a signal interconnection folded at its central portion to divide the same into first and second interconnection portions; and a plurality of select means provided correspondingly to a plurality of slave circuits to be selected in accordance with a signal transmitted through said signal interconnection, respectively, said plurality of select means being arranged along said signal interconnection with a space of a distance DL between each other, the select means nearest to the folded position of said signal interconnection being spaced by a predetermined distance Lp from said folded position, said select signal generating means issuing said two pulse signals at a time interval of $2\times\{\tau 1+\tau 2(j-1)\}$ to one end of said signal interconnection for selecting the slave circuit corresponding to the select means at a jth position from the folded position of said signal interconnection, $\tau 1$ being a time required for transmission of the pulse signal through said distance of Lp and $\tau 2$ being a time required for transmission of the pulse signal through the distance of DL, and said select means selecting the corresponding slave circuit in response to the active state of both the pulse signals sent from said first and second interconnection portions.

9. The slave circuit select device according to claim 8, further comprising:

antireflection means connected to the other end of said signal interconnection for preventing reflection of the received pulse signal.

10. The slave circuit select device according to claim 9, wherein each of said select means includes an AND gate receiving on one of its inputs the signal sent from said first interconnection portion and receiving on the other input the signal sent from said second interconnection portion.

11. The slave circuit select device according to claim 9, wherein each of said select means includes a D-flip-flop receiving the signal sent from said second interconnection portion in accordance with the signal sent from said first interconnection portion.

* * * * *